United States Patent
Bhatia et al.

(10) Patent No.: US 10,938,419 B2
(45) Date of Patent: Mar. 2, 2021

(54) ENCODING METHOD AND SYSTEM FOR MEMORY DEVICE INCLUDING QLC CELLS

(71) Applicant: SK hynix Inc., Gyeonggi-do (KR)

(72) Inventors: Aman Bhatia, San Jose, CA (US); Naveen Kumar, San Jose, CA (US); Fan Zhang, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/297,204

(22) Filed: Mar. 8, 2019

(65) Prior Publication Data

US 2019/0288710 A1    Sep. 19, 2019

Related U.S. Application Data

(60) Provisional application No. 62/643,975, filed on Mar. 16, 2018.

(51) Int. Cl.
    *H03M 13/29*    (2006.01)
    *G06F 11/10*    (2006.01)
    *G11C 11/56*    (2006.01)
    *G11C 29/52*    (2006.01)
    *H03M 13/05*    (2006.01)
    (Continued)

(52) U.S. Cl.
    CPC ..... *H03M 13/2906* (2013.01); *G06F 11/1068* (2013.01); *G06F 11/1072* (2013.01); *G11C 11/5628* (2013.01); *G11C 11/5635* (2013.01); *G11C 11/5642* (2013.01);
    (Continued)

(58) Field of Classification Search
    CPC .............. H03M 13/2906; H03M 13/05; G11C 11/5628; G11C 11/5642; G11C 29/52; G11C 11/5635; G11C 2029/0411; G11C 16/0483; G06F 11/1072; G06F 11/1068
    USPC ....... 714/755, 758, 763, 768, 769, 773, 777, 714/799, 800, 809
    See application file for complete search history.

(56) References Cited

U.S. PATENT DOCUMENTS

| 8,463,985 B2 * | 6/2013 | Franceschini ....... G06F 12/0246 |
| | | 711/103 |
| 9,245,653 B2 * | 1/2016 | Hyun .................. G11C 11/5642 |

(Continued)

FOREIGN PATENT DOCUMENTS

KR    10-2017-0018796    2/2017

OTHER PUBLICATIONS

Jiang et al., Constrained Codes for Phase-change Memories, 2011, IEEE, pp. 1-5. (Year: 2011).*

(Continued)

*Primary Examiner* — John J Tabone, Jr.
(74) *Attorney, Agent, or Firm* — IP & T Group LLP

(57) ABSTRACT

Encoding methods and systems are provided for a memory device including quadruple-level cell (QLC) memory cells. A controller of a memory system includes a constrained encoding device including a first encoder and a second encoder. The first encoder jointly encodes, based on a constrained code, two data bits corresponding to two logical pages, selected from among multiple logical pages. The second encoder independently encodes, based on an error-correction code, the encoded data bits and remaining data bits to generate symbols corresponding to a plurality of program-voltage (PV) levels, the remaining data bits corresponding to two non-selected logical pages among the multiple logical pages.

20 Claims, 20 Drawing Sheets

(51) Int. Cl.
*G11C 16/04* (2006.01)
*G11C 29/04* (2006.01)

(52) U.S. Cl.
CPC ............ *G11C 29/52* (2013.01); *H03M 13/05* (2013.01); *G11C 16/0483* (2013.01); *G11C 2029/0411* (2013.01)

(56) References Cited

U.S. PATENT DOCUMENTS

| | | | |
|---|---|---|---|
| 9,595,318 B2* | 3/2017 | Hyun | G11C 29/52 |
| 9,928,126 B1* | 3/2018 | Shappir | G06F 11/108 |
| 2010/0223530 A1* | 9/2010 | Son | G06F 11/1072 |
| | | | 714/763 |
| 2011/0246703 A1* | 10/2011 | Franceschini | G11C 16/0483 |
| | | | 711/103 |
| 2011/0280068 A1* | 11/2011 | Patapoutian | G11C 11/5628 |
| | | | 365/185.03 |
| 2011/0296273 A1* | 12/2011 | Rub | G06F 11/10 |
| | | | 714/755 |
| 2014/0059406 A1* | 2/2014 | Hyun | G11C 11/5621 |
| | | | 714/773 |
| 2015/0178152 A1* | 6/2015 | Cai | H03M 13/2906 |
| | | | 714/757 |
| 2016/0118111 A1* | 4/2016 | Hyun | G11C 11/5635 |
| | | | 365/185.03 |
| 2016/0125951 A1* | 5/2016 | Sun | G11C 29/021 |
| | | | 365/185.24 |
| 2017/0371565 A1* | 12/2017 | Liu | G11C 16/08 |
| 2018/0067802 A1* | 3/2018 | Ha | G06F 12/0866 |
| 2018/0349645 A1* | 12/2018 | Helmick | G11B 20/1833 |
| 2019/0213074 A1* | 7/2019 | Bhatia | G11C 11/5642 |

OTHER PUBLICATIONS

Qin et al., Time-Space Constrained Codes for Phase-Change Memories, 2011, IEEE, pp. 1-6. (Year: 2011).*

Qin, Fractional Bits-per-cell for NAND Flash with Low Read Latency, 2017, IEEE, pp. 1-6. (Year: 2017).*

Adler R. L et al., Algorithms for Sliding Block Codes—an Application of Symbolic Dynamics to Information Theory, IEEE Transactions on Information Theory, Jan. 1983, pp. 5-22, vol. IT-29, No. 1.

* cited by examiner

FIG. 9

|      | PV15 — PV0 —PV15 | | | PV15 — PV0 —PV14 | | | PV14 — PV0 —PV15 | | | PV14 — PV0 —PV14 | | |
|------|---|---|---|---|---|---|---|---|---|---|---|---|
| MSB  | 1 | 1 | 1 | 1 | 1 | 1 | 1 | 1 | 1 | 1 | 1 | 1 |
| MCSB | 1 | 1 | 1 | 1 | 1 | 0 | 0 | 1 | 1 | 0 | 1 | 0 |
| LCSB | 0 | 1 | 0 | 0 | 1 | 0 | 0 | 1 | 0 | 0 | 1 | 0 |
| LSB  | 1 | 1 | 1 | 1 | 1 | 1 | 1 | 1 | 1 | 1 | 1 | 1 |

|      | PV15 — PV1 —PV15 | | | PV15 — PV1 —PV14 | | | PV14 — PV1 —PV15 | | | PV14 — PV1 —PV14 | | |
|------|---|---|---|---|---|---|---|---|---|---|---|---|
| MSB  | 1 | 1 | 1 | 1 | 1 | 1 | 1 | 1 | 1 | 1 | 1 | 1 |
| MCSB | 1 | 1 | 1 | 1 | 1 | 0 | 0 | 1 | 1 | 0 | 1 | 0 |
| LCSB | 0 | 1 | 0 | 0 | 1 | 0 | 0 | 1 | 0 | 0 | 1 | 0 |
| LSB  | 1 | 0 | 1 | 1 | 0 | 1 | 1 | 0 | 1 | 1 | 0 | 1 |

ENCODING METHOD AND SYSTEM FOR MEMORY DEVICE INCLUDING QLC CELLS

CROSS-REFERENCE TO RELATED APPLICATION

This application claims the benefit of U.S. Provisional Application No. 62/643,975, filed on Mar. 16, 2018, the entire contents of which are incorporated herein by reference.

BACKGROUND

1. Field

Embodiments of the present disclosure relate to an encoding scheme for a memory device.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

Memory systems using memory devices provide excellent stability, durability, high information access speed, and low power consumption, since they have no moving parts. Examples of memory systems having such advantages include universal serial bus (USB) memory devices, memory cards having various interfaces, and solid state drives (SSDs). Memory systems use various encoding schemes for memory cells.

SUMMARY

Aspects of the present invention include encoding methods and systems for a memory device including quadruple-level cell (QLC) memory cells.

In one aspect, a memory system includes a memory device including quadruple-level cells (QLCs), and a controller including a constrained encoding device. The constrained encoding device includes a first encoder and a second encoder. The first encoder jointly encodes, based on a constrained code, two data bits corresponding to two logical pages, selected from among multiple logical pages. The second encoder independently encodes, based on an error-correction code, the encoded data bits and remaining data bits to generate symbols corresponding to a plurality of program-voltage (PV) levels, the remaining data bits corresponding to two non-selected logical pages among the multiple logical pages.

In another aspect, a memory system includes a memory device including quadruple-level cells (QLCs), and a controller including a constrained encoding device. The constrained encoding device includes a first encoder and a second encoder. The first encoder jointly encodes, based on a constrained code, first and third data corresponding to first and third logical pages among a plurality of logical pages. The second encoder independently encodes, based on an error-correction code, second and fourth data, and the encoded first and third data to generate symbols corresponding to a plurality of program-voltage (PV) levels, the second and fourth data corresponding to second and fourth logical pages among the plurality of logical pages.

In still another aspect, a method for operating a memory system including a memory device including quadruple-level cells (QLCs) includes: jointly encoding, based on a constrained code, two data bits corresponding to two logical pages, selected from among multiple logical pages; and independently encoding, based on an error-correction code, the encoded data bits and remaining data bits to generate symbols corresponding to a plurality of program-voltage (PV) levels, the remaining data bits corresponding to two non-selected logical pages among the multiple logical pages.

Additional aspects of the present invention will become apparent from the following description.

BRIEF DESCRIPTION OF THE DRAWINGS

FIG. 9 is a diagram illustrating inter-cell interference in a memory device using Gray code of FIG. 7.

DETAILED DESCRIPTION

Figure 1:
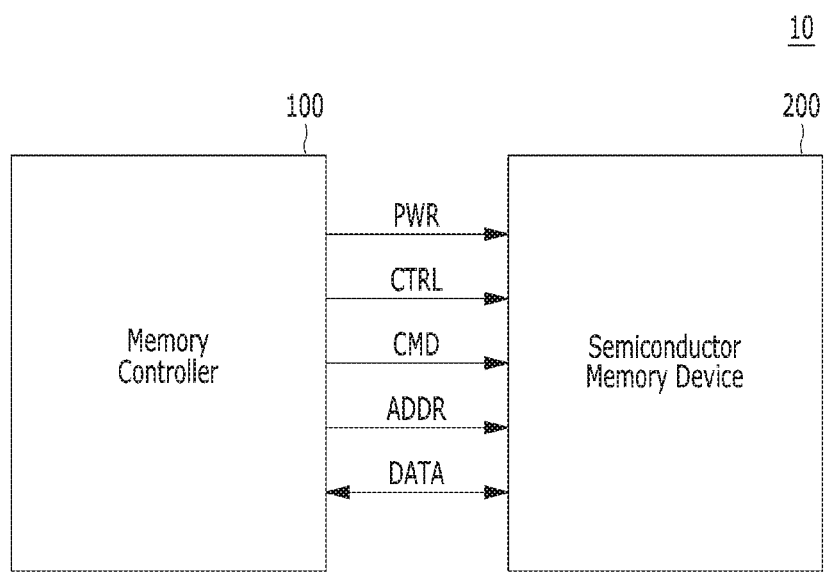
FIG. 1 is a block diagram illustrating a memory system in accordance with an embodiment of the present invention.

Various embodiments are described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Moreover, reference herein to "an embodiment," "another embodiment," or the like is not necessarily to only one embodiment, and different references to any such phrase are not necessarily to the same embodiment(s). Throughout the disclosure, like reference numerals refer to like parts in the figures and embodiments of the present invention.

The invention can be implemented in numerous ways, including as a process; an apparatus; a system; a computer program product embodied on a computer-readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

A detailed description of embodiments of the invention is provided below along with accompanying figures that illustrate aspects of the invention. The invention is described in connection with such embodiments, but the invention is not limited to any embodiment. The scope of the invention is limited only by the claims. The invention encompasses numerous alternatives, modifications and equivalents within the scope of the claims. Numerous specific details are set forth in the following description in order to provide a thorough understanding of the invention. These details are provided for the purpose of example; the invention may be practiced according to the claims without some or all of these specific details. For clarity, technical material that is known in technical fields related to the invention has not been described in detail so that the invention is not unnecessarily obscured.

FIG. 1 is a block diagram illustrating a memory system 10 in accordance with an embodiment of the present invention.

Referring FIG. 1, the memory system 10 may include a memory controller 100 and a semiconductor memory device 200, which may represent more than one such device. The semiconductor memory device(s) 200 may be flash memory device(s), particularly of the NAND-type.

The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output (I/O) lines. The semiconductor memory device 200 may receive power PWR through a power line and a control signal CTRL through a control line. The control signal CTRL may include a command latch enable (CLE) signal, an address latch enable (ALE) signal, a chip enable (CE) signal, a write enable (WE) signal, a read enable (RE) signal, and the like.

The memory controller 100 and the semiconductor memory device 200 may be integrated in a single semiconductor device such as a solid state drive (SSD). The SSD may include a storage device for storing data therein. When the semiconductor memory system 10 is used in an SSD, operation speed of a host (not shown) coupled to the memory system 10 may remarkably improve.

The memory controller 100 and the semiconductor memory device 200 may be integrated in a single semiconductor device such as a memory card. For example, the memory controller 100 and the semiconductor memory device 200 may be so integrated to form a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

In another embodiment, the memory system 10 may be provided as one of various components in an electronic device such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

Figure 2:
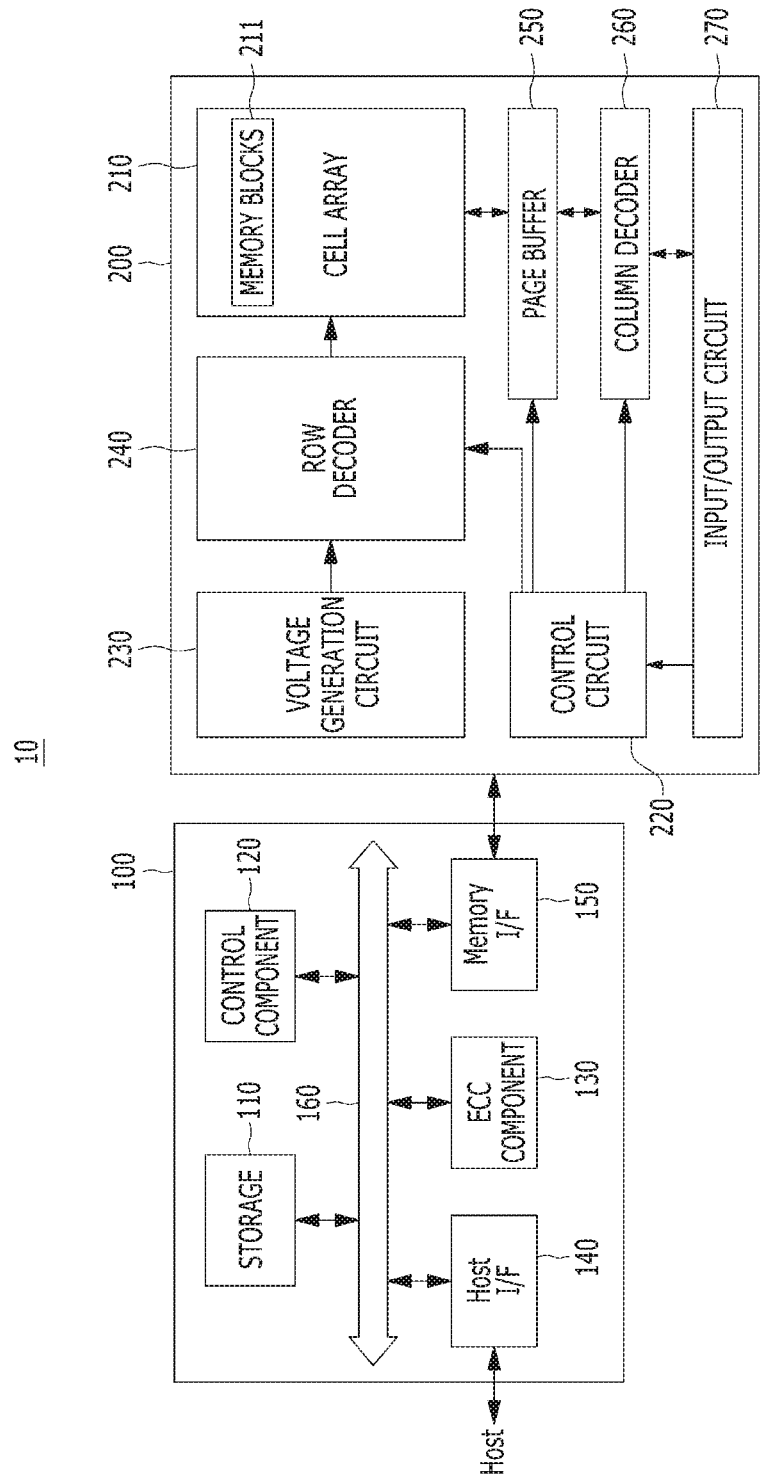
FIG. 2 is a block diagram illustrating a memory system in accordance with an embodiment of the present invention.

FIG. 2 is a detailed block diagram illustrating a memory system in accordance with an embodiment of the present invention. For example, the memory system of FIG. 2 may depict the memory system shown in FIG. 1.

Referring to FIG. 2, the memory system 10 may include a memory controller 100 and a semiconductor memory device 200. The memory system 10 may operate in response to a request from a host device, and in particular, store data to be accessed by the host device.

The host device may be implemented with any one of various kinds of electronic devices. In some embodiments, the host device may include an electronic device such as a desktop computer, a workstation, a three-dimensional (3D) television, a smart television, a digital audio recorder, a digital audio player, a digital picture recorder, a digital picture player, and/or a digital video recorder and a digital video player. In some embodiments, the host device may include a portable electronic device such as a mobile phone, a smart phone, an e-book, an MP3 player, a portable multimedia player (PMP), and/or a portable game player.

The memory device 200 may store data to be accessed by the host device.

The memory device 200 may be implemented with a volatile memory device such as a dynamic random access memory (DRAM) and/or a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120, which may be implemented as a processor such as a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and store data for driving the memory system 10 and the controller 100. When the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operations of the memory system 10, and a write operation or a read operation for the memory device 200, in response to a write request or a read request from the host device. The control component 120 may drive firmware, which is referred to as a flash translation layer (FTL), to control general operations of the memory system 10. For example, the FTL may perform operations such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure in correcting the error bits.

In some embodiments, the ECC component 130 may perform an error correction operation based on a coded modulation such as a low-density parity-check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a Block coded modulation (BCM). As such, the ECC component 130 may include all circuits, systems or devices for suitable error correction operation.

The host interface 140 may communicate with the host device through one or more of various interface protocols such as a universal serial bus (USB), a multi-media card (MMC), a peripheral component interconnect express (PCI-e), a small computer system interface (SCSI), a serial-attached SCSI (SAS), a serial advanced technology attachment (SATA), a parallel advanced technology attachment (PATA), an enhanced small disk interface (ESDI), an integrated drive electronics (IDE), and non-volatile memory express (NVMe).

The memory interface 150 may provide an interface between the controller 100 and the memory device 200 to allow the controller 100 to control the memory device 200 in response to a request from the host device. The memory interface 150 may generate control signals for the memory device 200 and process data under the control of the CPU 120. When the memory device 200 is a flash memory such as a NAND flash memory, the memory interface 150 may generate control signals for the memory and process data under the control of the CPU 120.

The memory device 200 may include a memory cell array 210, a control circuit 220, a voltage generation circuit 230, a row decoder 240, a page buffer 250, which may be in the form of an array of page buffers, a column decoder 260, and an input/output circuit 270. The memory cell array 210 may include a plurality of memory blocks 211 which may store data. The voltage generation circuit 230, the row decoder 240, the page buffer array 250, the column decoder 260 and the input/output circuit 270 may form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks.

Figure 3:
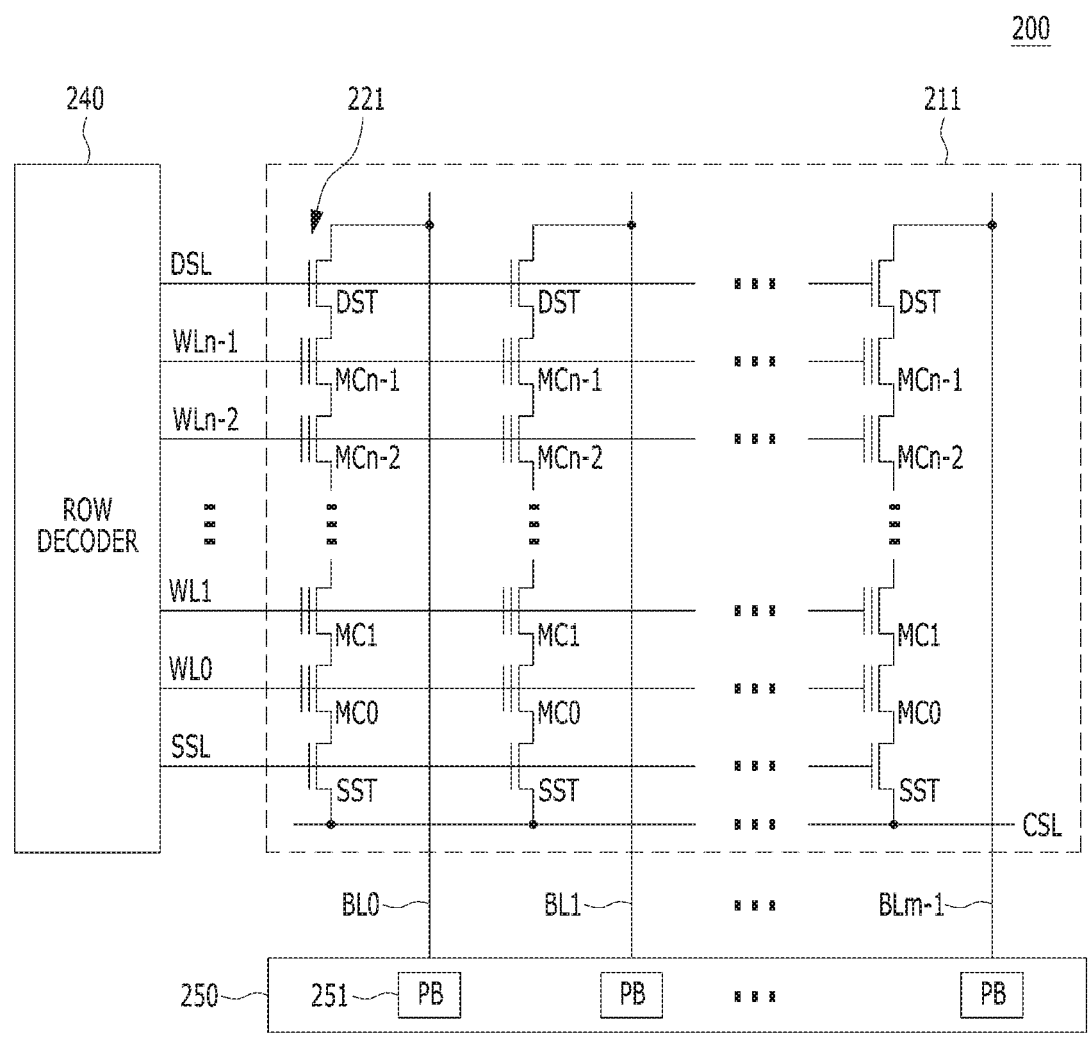
FIG. 3 is a circuit diagram illustrating a memory block of a memory device of a memory system in accordance with an embodiment of the present invention.

The page buffer 250 may be in electrical communication with the memory cell array 210 through bit lines BL (shown in FIG. 3). The page buffer 250 may pre-charge the bit lines BL with a positive voltage, transmit data to, and receive data from, a selected memory block in program and read operations, or temporarily store transmitted data, in response to page buffer control signal(s) generated by the control circuit 220.

The column decoder 260 may transmit data to, and receive data from, the page buffer 250 or exchange data with the input/output circuit 270.

The input/output circuit 270 may transmit to the control circuit 220 a command and an address, received from an external device (e.g., the memory controller 100), transmit data from the external device to the column decoder 260, or output data from the column decoder 260 to the external device, through the input/output circuit 270.

The control circuit 220 may control the peripheral circuit in response to the command and the address.

FIG. 3 is a circuit diagram illustrating a memory block of a semiconductor memory device in accordance with an embodiment of the present invention. For example, the memory block of FIG. 3 may be any of the memory blocks 211 of the memory cell array 200 shown in FIG. 2.

Referring to FIG. 3, the exemplary memory block 211 may include a plurality of word lines WL0 to WLn−1, a drain select line DSL and a source select line SSL coupled to the row decoder 240. These lines may be arranged in parallel, with the plurality of word lines between the DSL and SSL.

The exemplary memory block 211 may further include a plurality of cell strings 221 respectively coupled to bit lines BL0 to BLm−1. The cell string of each column may include one or more drain selection transistors DST and one or more source selection transistors SST. In the illustrated embodiment, each cell string has one DST and one SST.

In a cell string, a plurality of memory cells or memory cell transistors MC0 to MCn−1 may be serially coupled between the selection transistors DST and SST. Each of the memory cells may be formed as a single level cell (SLC) storing 1 bit of data. Each of the memory cells may be formed as a multi-level cell (MLC) storing 2 bits of data. Each of the memory cells may be formed as a triple-level cell (TLC) storing 3 bits of data. Each of the memory cells may be formed as a quadruple-level cell (QLC) storing 4 bits of data.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

The page buffer array 250 may include a plurality of page buffers 251 that are coupled to the bit lines BL0 to BLm−1. The page buffers 251 may operate in response to page buffer control signals. For example, the page buffers 251 my temporarily store data received through the bit lines BL0 to BLm−1 or sense voltages or currents of the bit lines during a read or verify operation.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

Figure 4:
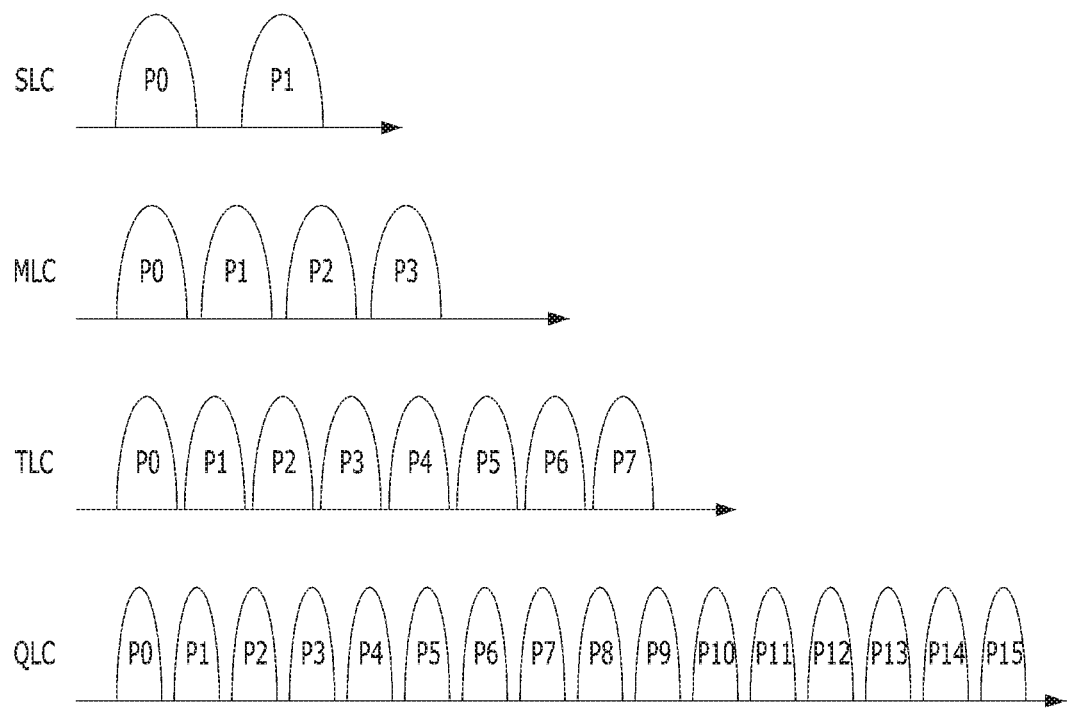
FIG. 4 is a diagram illustrating states for cells of a memory device.

FIG. 4 is a diagram illustrating distributions of program states or voltage levels for different types of cells of a memory device.

Referring to FIG. 4, each of memory cells may be implemented with a single level cell (SLC) storing 1 bit of data, a multi-level cell (MLC) storing 2 bits of data, a triple-level cell (TLC) storing 3 bits of data, or a quadruple-level cell (QLC) storing 4 bits of data.

Memory cells of SLC may include two states P0 and P1. P0 may indicate an erase state, and P1 may indicate a program state. Since the memory cells of SLC can be set in one of two different states, each of the memory cells may program or store 1 bit according to a set coding method. Memory cells of MLC may include four states P0, P1, P2 and P3. Among these states, P0 may indicate an erase state, and P1 to P3 may indicate program states. Since the memory cells of MLC can be set in one of four different states, each of the memory cells may program or store two bits according to a set coding method. Memory cells of TLC may include eight states P0 to P7. Among these states, P0 may indicate an erase state, and P1 to P7 may indicate program states. Since the memory cells of TLC can be set in one of eight different states, each of the memory cells may program or store three bits according to a set coding method. Memory cells of QLC may include 16 states P0 to P15. Among these states, P0 may indicate an erase state, and P1 to P15 may indicate program states. Since the memory cells of QLC can be set in one of sixteen different states, each of the memory cells may program or store four bits according to a set coding method.

Figure 5:
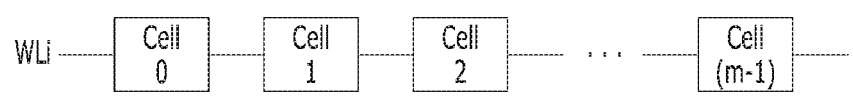
FIG. 5 is a diagram illustrating cells of a memory device.

FIG. 5 is a diagram illustrating cells of a memory device. Referring to FIG. 5, the memory device may include a plurality of memory cells Cell 0 to Cell (m−1), which are coupled to a word line WLi.

Figure 6:
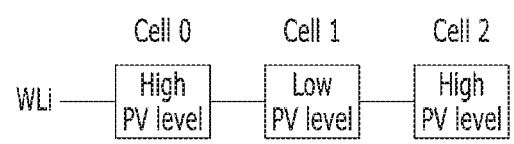
FIG. 6 is a diagram for describing inter-cell interference in a memory device.

FIG. 6 is a diagram for describing inter-cell interference (ICI) in a memory device.

Referring to FIG. 6, when data is read from the memory device (e.g., NAND flash memory) including memory cells Cell 0 to Cell 2 coupled to a word line WLi, errors may occur. A major source of errors in the data read from the NAND flash memory may be inter-cell interference. When a cell (e.g., Cell 1) in a low program-voltage (PV) level is surrounded by cells (e.g., Cell 0 and Cell 2) in high PV levels, a read reference (or threshold) voltage level of the cell in the low PV level may increase, causing it to be read back as the higher PV level.

NAND flash memories have become ubiquitous in many applications. As demand for flash memories increases, quadruple-level cell (QLC) flash memories are being developed where each cell can store 16 program-voltage (PV) levels (or symbols) which represent 4 bits belong to four logical pages. A Gray coding scheme may be used for mapping these sixteen symbols to patterns of 4 bits.

Figure 7:
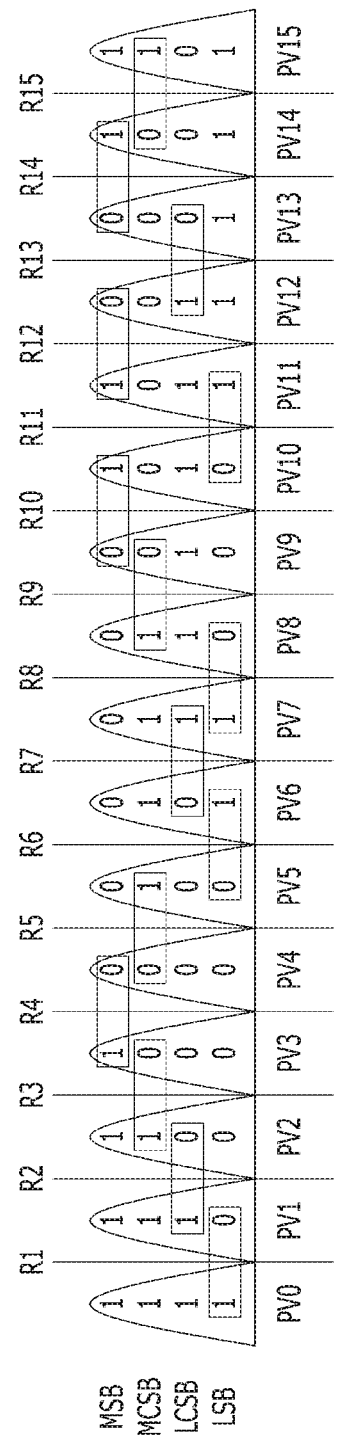
FIG. 7 is a diagram illustrating an example of Gray code for mapping between program-voltage (PV) levels and logical pages for a quadruple-level cell (QLC).

FIG. 7 is a diagram illustrating an example of Gray code for mapping between program-voltage (PV) levels and logical pages for a quadruple-level cell (QLC).

Referring to FIG. 7, a QLC cell have a threshold voltage or PV level out of sixteen possible PV levels PV0 to PV15. These PV levels correspond to the sixteen symbols that can be stored in each cell. The Gray code may map the 16 PV levels (or symbols) to 4-bit patterns such that the bit-mapping for any two adjacent PV levels differs only by 1 bit. The four bits are assigned to four different logical pages: a first page as a most significant bit (MSB) page, a second page as a most center significant bit (MCSB) page, a third page as a least center significant bit (LCSB) page and a fourth page as a least significant bit (LSB) page. In general, four pages of user data are stored on these logical pages independently. The bits sequence for all four pages are mapped to the symbol sequence using the Gray code and programmed to the cells on a word-line. Read operation for any of the logical pages can be performed with 3 or 4 NAND sensing operations. For example, to read the LSB page, NAND sensing operation is performed at read-thresholds marked R1, R6, R8 and R11. These four sensing operations are sufficient to read the LSB page, and it is not required to determine the exact symbol on each cell.

Referring again to FIG. 6, flash memories suffer from cell-to-cell or inter-cell interference such that programming a high PV level to a cell adjacent to a cell with low PV level causes errors. In other words, when a cell (e.g., Cell 1) in the low PV level is surrounded by cells (e.g., Cell 0 and Cell 2) in high PV levels, due to inter-cell interference, a read reference (or threshold) voltage level of the cell (e.g., Cell 1) in the low PV level may increase.

Figure 8:
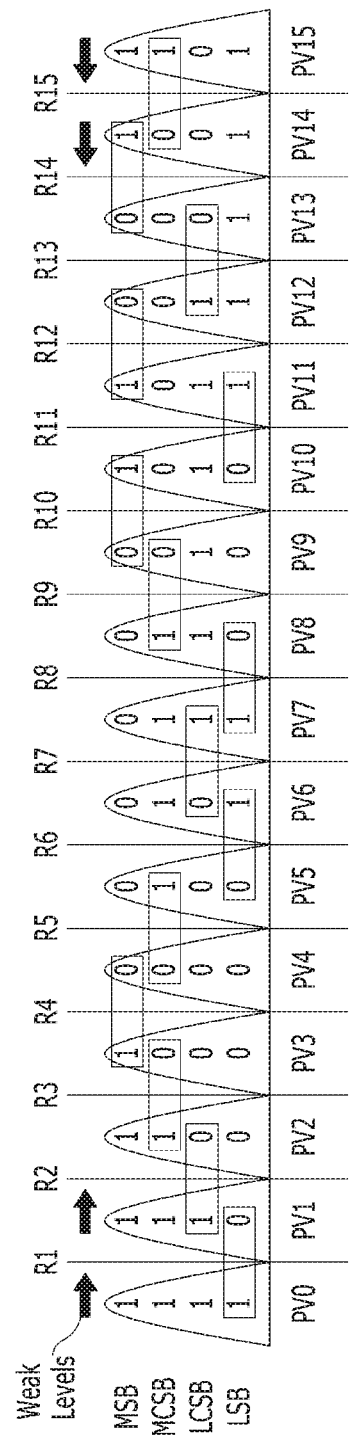
FIG. 8 is a diagram illustrating weak program-voltage (PV) levels in Gray code of FIG. 7.

FIG. 8 is a diagram illustrating weak program-voltage (PV) levels in Gray code of FIG. 7.

Referring to FIG. 8, weak PV levels are illustrated. Weak PV levels may represent PV levels affected by read-disturb or retention. For example, the PV0 and PV1 levels may be affected by read-disturb. The PV14 and PV15 levels may be affected by retention.

FIG. 9 is a diagram illustrating sequences of program-voltage (PV) levels in consecutive cells of a memory device using Gray code of FIG. 7, which may cause errors in read data due to inter-cell interference.

Referring to FIG. 9, when a cell in a low PV level is surrounded by cells in high PV levels, inter-cell interference may occur. The low PV levels may include PV levels PV0 and PV1, and the high PV levels may include PV levels PV14 and PV15. Further, the low PV levels may include PV levels PV2 and PV3, and the high PV levels may include PV levels PV12 and PV13. The following list represents examples of sequences of PV levels in consecutive cells that may cause errors in read data:

| | |
|---|---|
| PV15-PV0-PV15 | PV14-PV0-PV14 |
| PV15-PV1-PV15 | PV14-PV1-PV14 |
| PV15-PV0-PV14 | PV15-PV0-PV13 |
| PV15-PV1-PV14 | PV13-PV0-PV15 |
| PV14-PV0-PV15 | PV15-PV1-PV13 |
| PV14-PV1-PV15 | PV13-PV1-PV13 |

Sequences of PV levels causing inter-cell interference (ICI) have certain patterns of some pages (i.e., a most significant bit (MSB) page and a least center significant bit (LCSB page)) of all logical pages. In other words, the sequences of PV levels causing ICI have certain patterns of the MSB page "111" and the LCSB page "010" as depicted by dotted boxes in FIG. 9.

Therefore, it is desirable to avoid such patterns or sequences from being programmed to any word line. It is also desirable to do this without requiring too many NAND sensing operations which cause read performance degradation, and without requiring too many additional cells to perform the encoding, which decreases the user-bit density per word-line. It is desirable to avoid harmful sequences from being programmed to memory cells (e.g., QLCs) without significant rate loss or read performance degradation.

Embodiments of the present invention provide a scheme to avoid certain sequences having harmful patterns (e.g., forbidden sequences or interference-prone sequences) from being programmed in a quadruple-level cell (QLC) by encoding two out of four logical pages jointly with a suitably designed constrained code. The logical pages that are jointly encoded are chosen based on the mapping relation between program-voltage (PV) levels or symbols and bits of user data, as well as sequences of symbols that are to be avoided.

In various embodiments, an encoding device may encode bit sequences of user data (i.e., user data bit sequences) for two logical pages (e.g., MSB and LCSB logical pages) together. The encoding device may ensure that bit sequences corresponding to harmful symbol sequences may be avoided with negligible rate loss. Reading either the two logical pages may require additional sensing operations, which may be minimized by a careful design of the Gray code mapping. Reading the two logical pages requires no additional NAND sensing operations.

Figure 10:
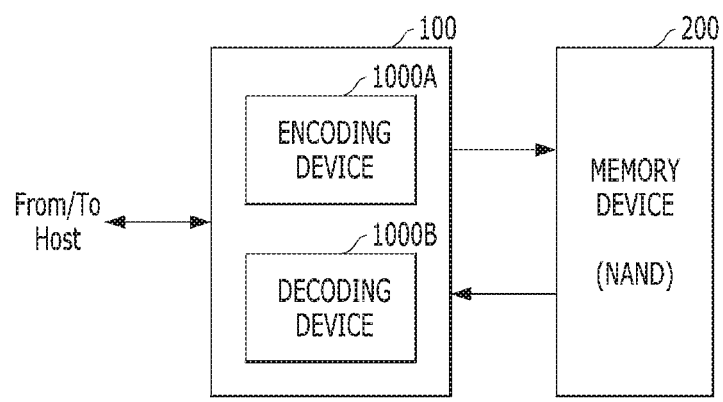
FIG. 10 is a diagram illustrating a memory system in accordance with an embodiment of the present invention.

FIG. 10 is a diagram illustrating a memory system in accordance with an embodiment of the present invention.

Referring to FIG. 10, the memory system may include a controller 100 and a memory device 200. The memory device 200 may include a NAND-type flash memory device with memory cells such as single-level cells (SLCs), multi-level cells (MLCs), triple-level cells (TLCs) or quadruple-level cells (QLCs). In various embodiments, the memory device 200 may include a NAND-type flash memory device with QLC memory cells (i.e., QLCs).

The controller 100 may receive a command from a host (not shown), and provide the memory device 200 with the received command. For example, the controller 100 receives a write command and write data corresponding to the write command, and controls the memory device 200 to perform a program operation on the write data. For another example, the controller 100 receives a read command, and controls the memory device 200 to perform a read operation on data corresponding to the read command. The controller 100 transmits read data corresponding to the read command to the host.

The controller 100 may include an encoding device 1000A and a decoding device 1000B. During the program operation, the encoding device 1000A may perform an encoding operation on the write data based on a set encoding scheme. During the read operation, the decoding device 1000B may perform a decoding operation on the read data based on a set decoding scheme corresponding to the encoding scheme. The encoding scheme will be described in below with reference to FIGS. 11 to 17I. Although not described again here, the controller 100 and the memory device 200 may perform the operations described in FIGS. 1 and 2. In an embodiment, the encoding device 1000A and decoding device 1000B may be embodied in the ECC component 130, shown in FIG. 2, of the controller 100. Other suitable arrangements may be employed as well, as explained below.

Figure 11:
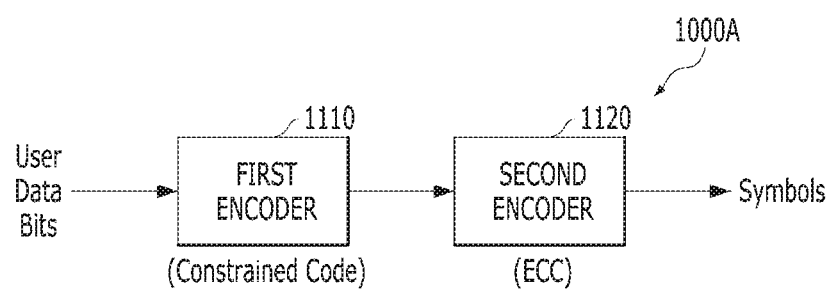
FIG. 11 is a diagram illustrating an encoding device in accordance with an embodiment of the present invention.

FIG. 11 is a diagram illustrating an encoding device in accordance with an embodiment of the present invention, for example, the encoding device 1000A of FIG. 10.

Referring to FIG. 11, the encoding device 1000A may include a first encoder 1110 and a second encoder 1120. The first encoder 1110 may encode based on a constrained code. The second encoder 1120 may encode based on an error correction code (ECC). Thus, the second encoder 1120 may be embodied in the ECC component 130, while the first encoder 1110 is disposed externally to the ECC component 130.

The first encoder 1110 may receive data bits (e.g., user data bits) from a host (not shown). The data bits may include two data bits and remaining data bits. The two data bits may correspond to two logical pages, selected from among a plurality of logical pages (or multiple logical pages) (e.g., four logical pages). The remaining data bits may correspond to two non-selected logical pages among the plurality of logical pages.

The first encoder 1110 may jointly encode the two data bits based on the constrained code. The second encoder 1120 may independently encode the encoded user bits and the remaining data bits based on the ECC. The second encoder 1120 may generate symbols as the encode results corresponding to a plurality of program-voltage (PV) levels (e.g., 16 PV levels).

In various embodiments, the two logical pages may be selected based on the mapping relationship between the PV levels and the data bits, and certain forbidden sequences (or interference-prone sequences) among the symbols.

In various embodiments, the two logical pages may include first and third logical pages among the four logical pages, and the non-selected logical pages may include second and fourth logical pages among the four logical pages.

In various embodiments, the first logical page may include the most significant bit (MSB) page, the second logical page may include the most center significant bit (MCSB) page, the third logical page may include the least center significant bit (LCSB) page, and the fourth logical page may include the least significant bit (LSB) page.

In various embodiments, the constrained code may include a code such that bits having the forbidden sequences are avoided. The bits having the forbidden sequences may correspond to the MSB and LCSB pages.

In various embodiments, a sequence of bits corresponding to the MSB page includes a value of "111", and a sequence of bits corresponding to the LCSB page includes a value of "010".

Figure 12:
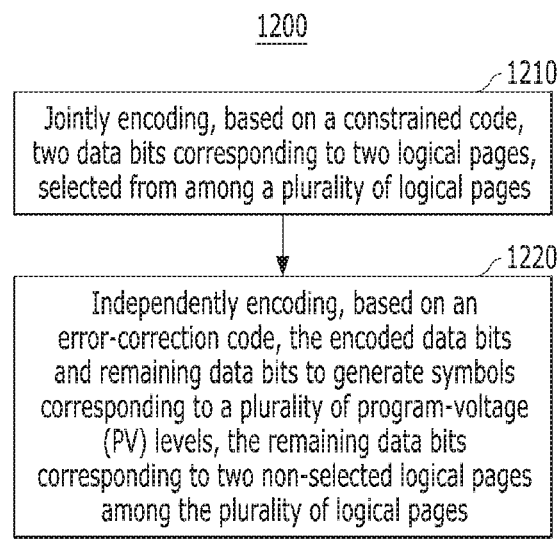
FIG. 12 is a flowchart illustrating an operation method of an encoding device in accordance with an embodiment of the present invention.

FIG. 12 is a flowchart illustrating an operation method 1200 of an encoding device in accordance with an embodiment of the present invention.

Referring to FIG. 12, the method 1200 may include steps 1210 and 1220, which may be performed by the encoding device 1000A of FIG. 11. The encoding device 1000A may receive data bits (e.g., user data bits) from a host (not shown). The data bits may include two data bits and remaining data bits. The two data bits may correspond to two logical pages, selected from among a plurality of logical pages (or multiple logical pages) (e.g., four logical pages). The remaining data bits may correspond to two non-selected logical pages among the plurality of logical pages.

At step 1210, the encoding device 1000A may jointly encode the two data bits based on a constrained code. The two data bits may correspond to the two logical pages, selected from among the plurality of logical pages.

At step 1220, the encoding device 1000A may independently encode the encoded data bits at step 1210 and the remaining data bits based on an error-correction code. The encoding device 1000A may generate symbols corresponding to a plurality of program-voltage (PV) levels.

In various embodiments, the two logical pages may be selected based on the mapping relationship between the PV levels and the data bits, and certain forbidden sequences (or interference-prone sequences) among the symbols.

In various embodiments, the two logical pages may include first and third logical pages among the four logical pages, and the non-selected logical pages may include second and fourth logical pages among the four logical pages.

In various embodiments, the first logical page may include the most significant bit (MSB) page, the second logical page may include the most center significant bit (MCSB) page, the third logical page may include the least center significant bit (LCSB) page, and the fourth logical page may include the least significant bit (LSB) page.

In various embodiments, the constrained code may include a code such that bits having the forbidden sequences are avoided. The bits having the forbidden sequences may correspond to the MSB and LCSB pages.

In various embodiments, a sequence of bits corresponding to the MSB page includes a value of "111", and a sequence of bits corresponding to the LCSB page includes a value of "010".

Figure 13:
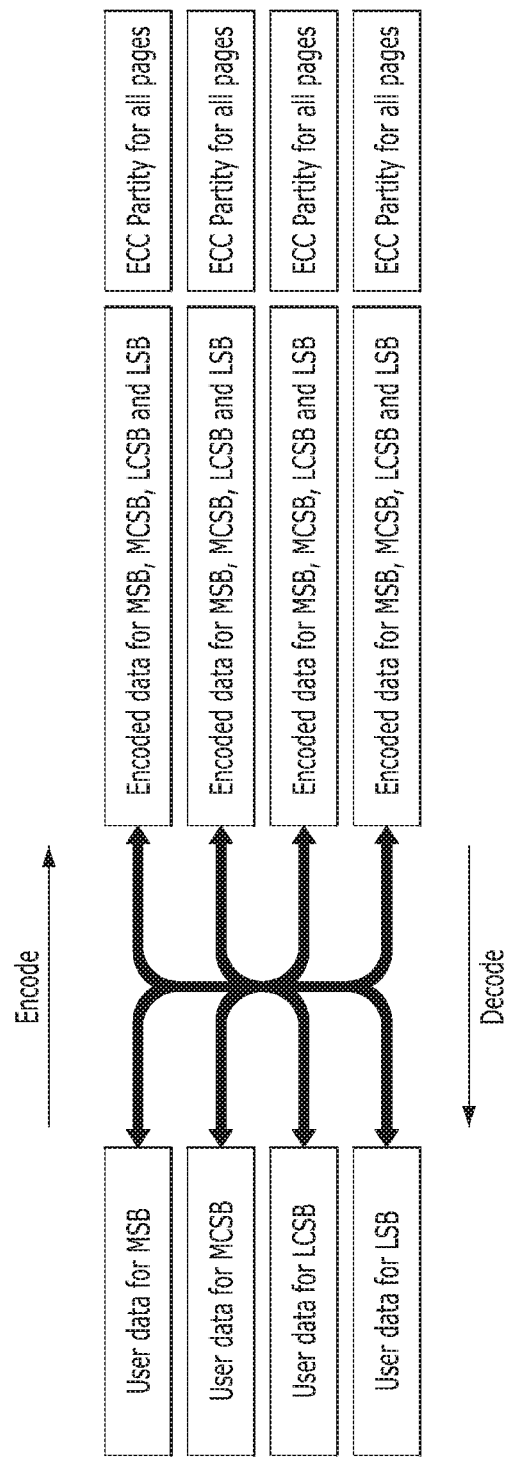
FIG. 13 is a diagram illustrating an operation of an encoding device in accordance with an embodiment of the present invention.

FIG. 13 is a diagram illustrating an operation of an encoding device in accordance with an embodiment of the present invention. The operation of FIG. 13 may be performed by the encoding device 1000A of FIG. 11.

Referring to FIG. 13, a constrained coding and an error correction coding may be applied to all pages jointly. In various embodiments, the pages may include four logical pages including the most significant bit (MSB) page, the most center significant bit (MCSB) page, the least center significant bit (LCSB) page, and the least significant bit (LSB) page.

The encoding device 1000A may encode user bit sequence for all pages using a constrained code and an error correction code to generate a sequence of symbols such that all harmful patterns or sequences described above are avoided. In other words, the encoding device 1000A may encode user data for the LSB page, user data for the LCSB page, user data for the MCSB page, and user data for the MSB page together using the constrained code and the error correction code. The encoding device 1000A may generate, as the sequence of symbols, encoded data for the LSB, LCSB, MCSB and MSB pages and error correction code (ECC) parities for all pages. The harmful patterns may be eliminated in the sequence of symbols.

The capacity of the encoding device 1000A using this constrained scheme may be 0.9993. This shows that the harmful patterns may be avoided completely with rate approaching 1, at least when coding is done jointly for all four pages. Constrained codes are generally known, and a suitable constrained code for the encoding device 1000A may be constructed in accordance with the teachings herein.

This encoding scheme may be performed with very little rate loss. However, every read operation will require a large number of sensing operations (e.g., 15 NAND sensing operations) to determine the exact symbol before the constrained code can be decoded.

Figure 14A:
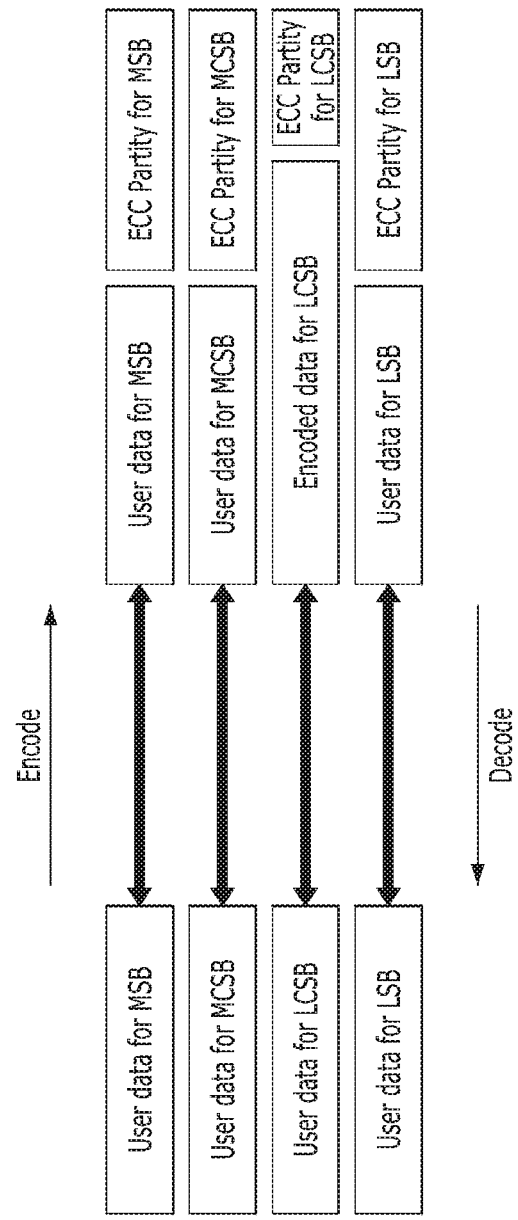
FIGS. 14A and 14B are diagrams illustrating operations of an encoding device in accordance with another embodiment of the present invention.
Figure 14B:
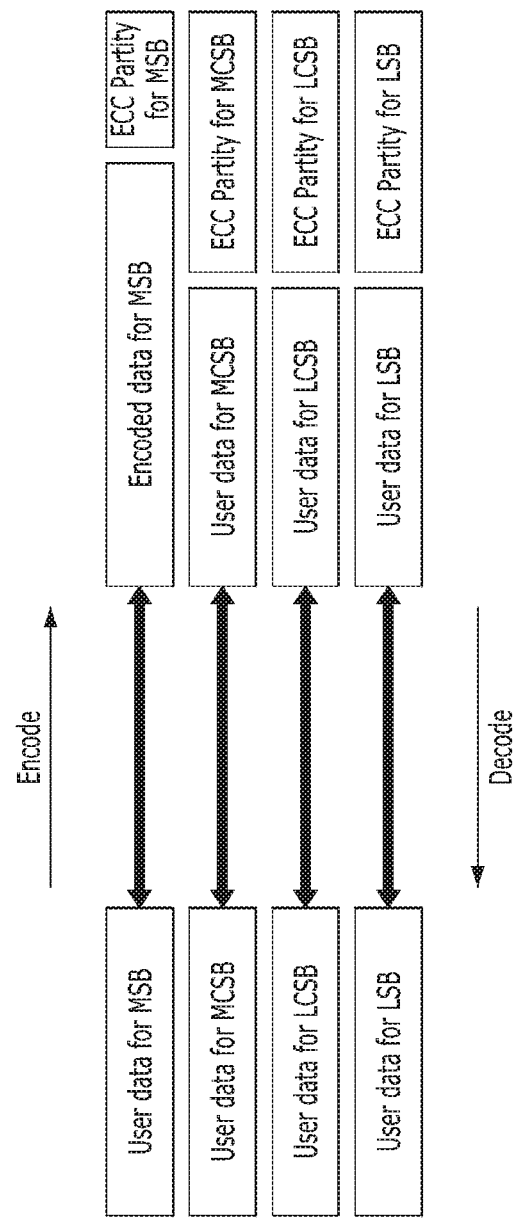

FIGS. 14A and 14B are diagrams illustrating operations of an encoding device in accordance with another embodiment of the present invention. The operations of FIGS. 14A and 14B may be performed by the encoding device 1000A of FIG. 11.

Referring to FIGS. 14A and 14B, a constrained coding and an error correction coding may be applied to one page among a plurality of pages (e.g., 4 pages), and the error correction coding may be applied to all other pages independently. In various embodiments, the pages may include four logical pages including the most significant bit (MSB) page, the most center significant bit (MCSB) page, the least center significant bit (LCSB) page, and the least significant bit (LSB) page. The one page may include the LCSB page as shown in FIG. 14A, or the MSB page as shown in FIG. 14B.

In FIG. 14A, the encoding device 1000A may encode user bit sequence for single page (i.e., the LCSB page) using a constrained code and an error correction code to generate a sequence of symbols such that certain bit sequences corresponding to harmful patterns or sequences described above are avoided. In other words, the encoding device 1000A may encode user data for the LCSB page using the constrained code and the error correction code, and may encode user data for the MSB, MCSB and LSB pages using the error correction code. The encoding device 1000A may generate, as the sequence of symbols, encoded data and error correction code (ECC) parity for the LCSB page, and may generate user data and ECC parities for the LSB, MCSB and MSB pages.

The encoding device 1000A may limit the constrained code to a single logical page (i.e., LCSB page) so that each logical page is decodable independently. It is ensured that the harmful pattern or sequence like PV15-PV0-PV15 (i.e., a bit sequence "0-1-0") in FIGS. 7 to 9 is not programmed. Avoiding the bit sequence "0-1-0" from being written on the LCSB page may be sufficient to eliminate the harmful patterns identified above. The capacity of the encoding device 1000A using this constrained scheme may be 0.8114. This shows that the rate of any code that may avoid the bit sequence "0-1-0" may not have a rate more than 0.8114.

In FIG. 14B, the encoding device 1000A may encode user bit sequence for single page (i.e., the MSB page) using a constrained code and an error correction code to generate a sequence of symbols such that certain bit sequences corresponding to harmful patterns or sequences described above are avoided. In other words, the encoding device 1000A may encode user data for the MSB page using the constrained code and the error correction code, and may encode user data for the MCSB, LCSB and LSB pages using the error correction code. The encoding device 1000A may generate, as the sequence of symbols, encoded data and error correction code (ECC) parity for the MSB page, and may generate user data and ECC parities for the MCSB, LCSB and MSB pages.

The encoding device 1000A may limit the constrained code to a single logical page (i.e., MSB page) so that each logical page is decodable independently. It is ensured that the harmful pattern or sequence like PV15-PV0-PV15 (i.e., a bit sequence "1-1-1") in FIGS. 7 to 9 is not programmed. Avoiding the bit sequence "1-1-1" from being written on the MSB page may be sufficient to eliminate the harmful patterns identified above. The capacity of the encoding device 1000A using this constrained scheme may be 0.8791. This shows that the rate of any code that may avoid the bit sequence "1-1-1" may not have a rate more than 0.8791.

Figure 15A:
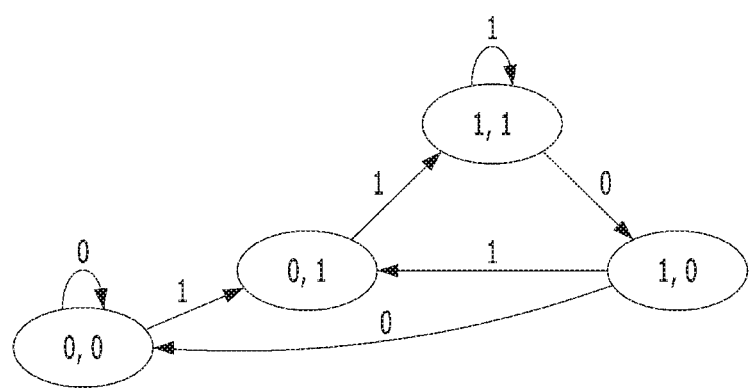
FIGS. 15A and 15B are state diagrams illustrating bit sequences processed by an encoding device in accordance with another embodiment of the present invention.
Figure 15B:
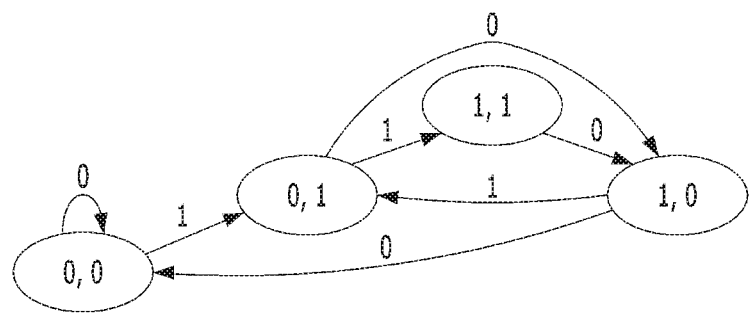

FIGS. 15A and 15B are state diagrams illustrating bit sequences processed by an encoding device in accordance with another embodiment of the present invention. The transitions of bit sequences in FIGS. 15A and 15B may be performed by the encoding device 1000A of FIG. 11. The transition of FIG. 15A may correspond to the encoding operation of FIG. 14A, and the transition of FIG. 15B may correspond to the encoding operation of FIG. 14B.

Referring to FIG. 15A, each state is indicated by a bit representing the current state and two bits (within the oval) representing the last two states. Most states including state (0,0), state (1,1) and state (1,0) have two outgoing transition possibilities. State (0,1) has only one outgoing transition possibility (i.e., "1") to state (1,1). Thus, the encoding device 1000A may forbid the bit sequence "0-1-0".

Referring to FIG. 15B, each state is indicated by a bit representing the current state and two bits (within the oval) representing the last two states. Most states including state (0,0), state (0,1) and state (1,0) have two outgoing transition possibilities. State (1,1) has only one outgoing transition possibilities (i.e., "0") to state (1,0). Thus, the encoding device 1000A may forbid the bit sequence "0-1-0".

In accordance with the encoding schemes shown in FIGS. 14A to 15B, certain bit sequences may be avoided, and each of the logical pages may still be read and decoded independently without reading exact symbols on each cell in the word line. However, removing all harmful patterns may cause significant rate loss, i.e., a large number of spare bits may be required for encoding bits of user data which reduces the density of bits of user data in a page of a memory device.

Figure 16:
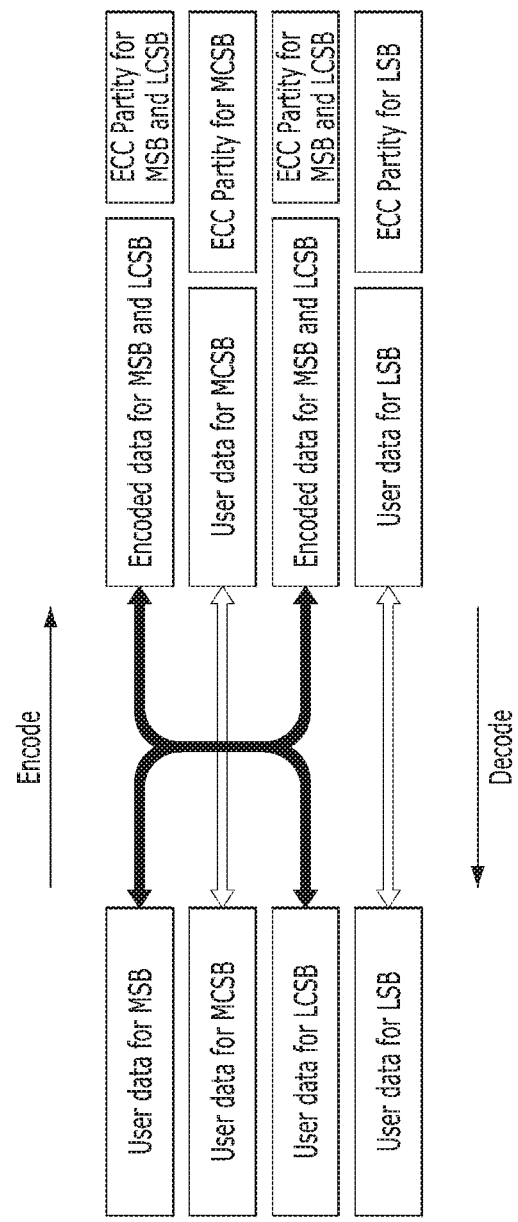
FIG. 16 is a diagram illustrating an operation of an encoding device in accordance with still another embodiment of the present invention.

FIG. 16 is a diagram illustrating an operation of an encoding device in accordance with still another embodiment of the present invention. The operation of FIG. 16 may be performed by the encoding device 1000A of FIG. 11.

Referring to FIG. 16, a constrained coding and an error correction coding may be applied to two pages selected from among a plurality of pages, and the error correction coding may be applied to other two pages independently. In various embodiments, the pages may include four logical pages including the most significant bit (MSB) page, the most center significant bit (MCSB) page, the least center significant bit (LCSB) page, and the least significant bit (LSB) page. The selected two pages may include the LCSB and MSB pages, and the other two pages may include the MCSB and LSB pages.

The encoding device 1000A may encode user bit sequence for two pages (i.e., the LCSB and MSB pages) using a constrained code and an error correction code to generate a sequence of symbols such that certain bit sequences corresponding to harmful patterns or sequences described above are avoided. In various embodiments, the certain bit sequences corresponding to harmful patterns or sequences may include sequences "(MSB=1, LCSB=0)-(MSB=1, LCSB=1)-(MSB=1, LCSB=0)".

In other words, the encoding device 1000A may encode user data for the LCSB and MSB pages using the constrained code and the error correction code, and may encode user data for the MCSB and LSB pages using the error correction code. The encoding device 1000A may generate, as the sequence of symbols, encoded data and error correction code (ECC) parity for the LCSB and MSB pages, and may generate user data and ECC parities for the MCSB and LSB pages.

As described above, the encoding device 1000A may perform constrained coding for two logical pages (i.e., MSB and LCSB pages) jointly, leaving the other two logical pages without any constrained coding, such that the encoding device 1000A avoids the certain bit sequences (MSB=1, LCSB=0)-(MSB=1, LCSB=1)-(MSB=1, LCSB=0). Then, 50% of the random reads may suffer degradation, and 50% of the random reads may not suffer any degradation. Thus, the encoding device 1000A may minimize the increase of read latency, which is caused by the encoding scheme as shown in FIG. 13. Avoiding the certain bit sequences (MSB=1, LCSB=0)-(MSB=1, LCSB=1)-(MSB=1, LCSB=0) may ensure that the harmful patterns above are avoided completely. The capacity of the encoding device 1000A using this constrained scheme may be 0.9890. Therefore, this constrained scheme does not cause rate loss and may avoid completely the harmful ICI patterns. Any constrained code that achieves a rate close to this value may be constructed using well-known techniques.

FIGS. 17A to 17I are state diagrams illustrating bit sequences processed by an encoding device in accordance with still another embodiment of the present invention. The transitions of bit sequences in FIGS. 17A and 17I may be performed by the encoding device 1000A of FIG. 11. For clarity, the transitions of FIG. 17A will be illustrated separately by transitions of FIGS. 17B and 17I.

Referring to FIGS. 17A to 17I, state $$\begin{pmatrix} b_{i-2}^{MSB}, & b_{i-1}^{MSB} \\ b_{i-2}^{LCSB} & b_{i-1}^{LCSB} \end{pmatrix}$$

denotes the last two bits on the MSB and LCSB pages. Edge labels ($b_i^{MSB}, b_i^{LCSB}$) denote the current bits corresponding to the MSB and LCSB pages, respectively.

Figure 17A:
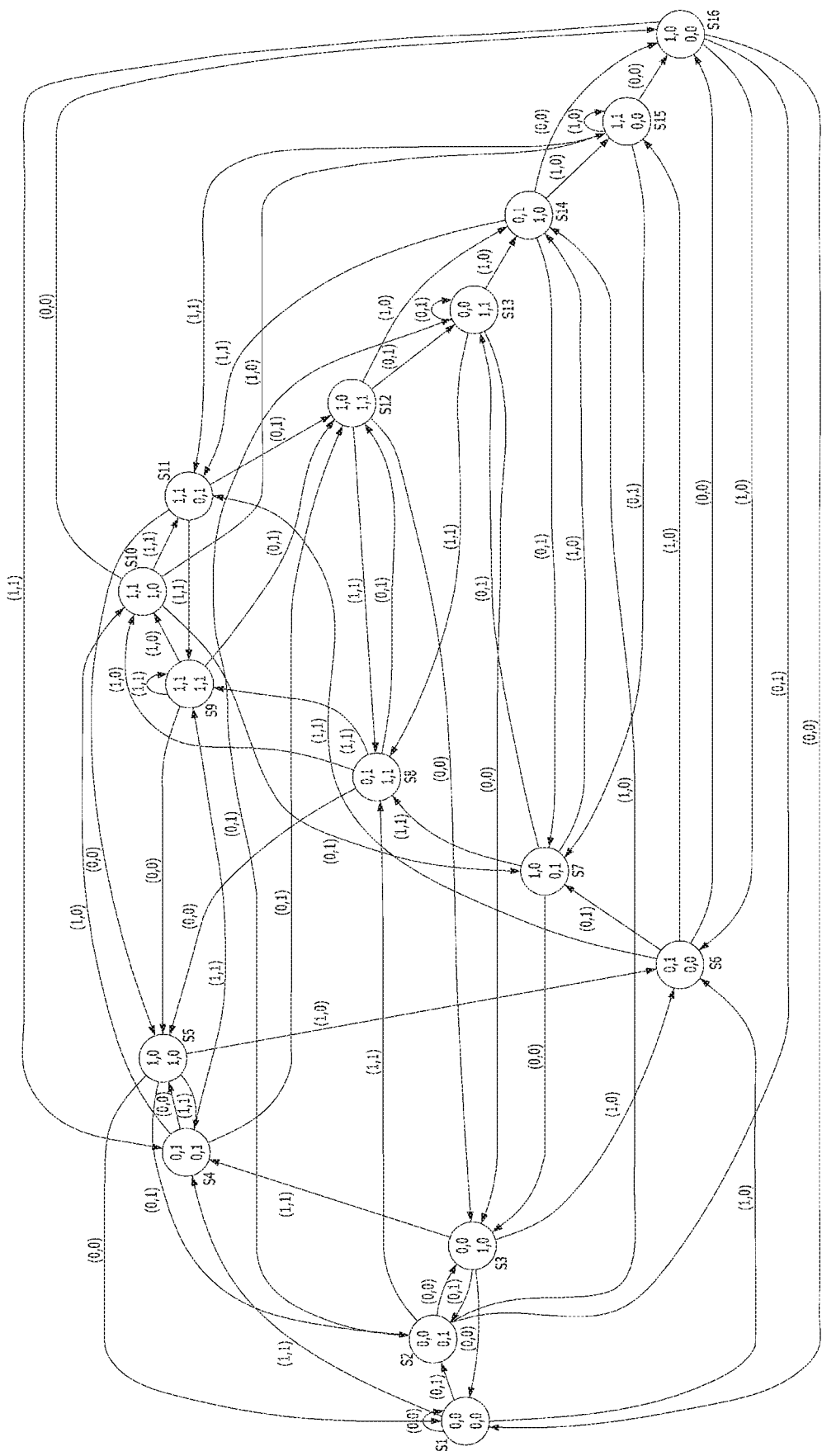
FIGS. 17A to 17I are state diagrams illustrating bit sequences processed by an encoding device in accordance with still another embodiment of the present invention.
Figure 17B:
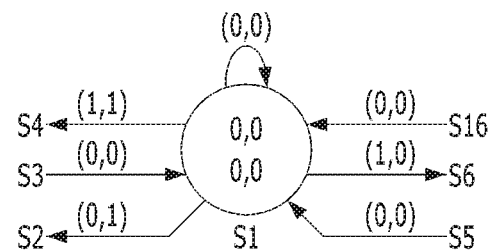
Figure 17B:
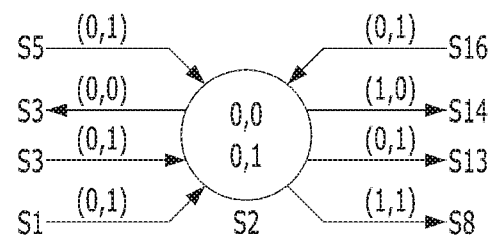
Figure 17C:
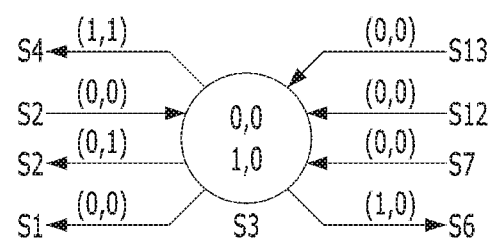
Figure 17C:
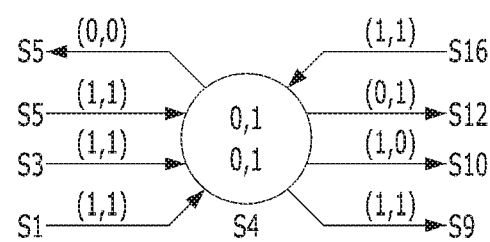
Figure 17D:
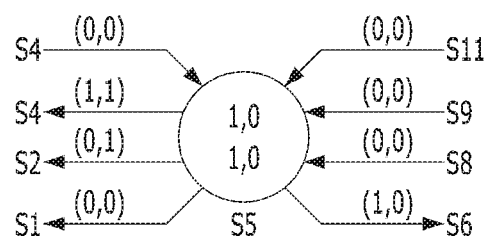
Figure 17D:
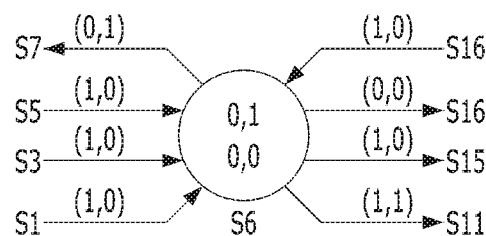
Figure 17E:
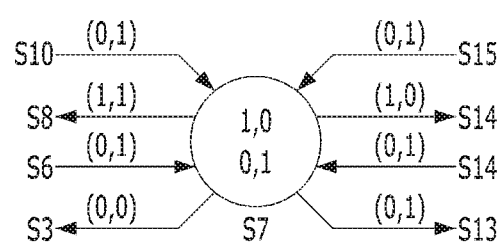
Figure 17E:
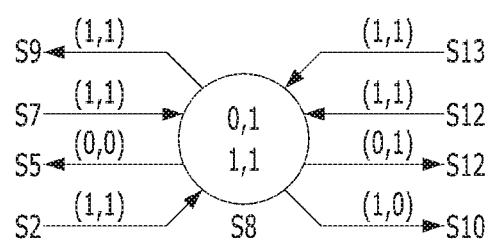
Figure 17F:
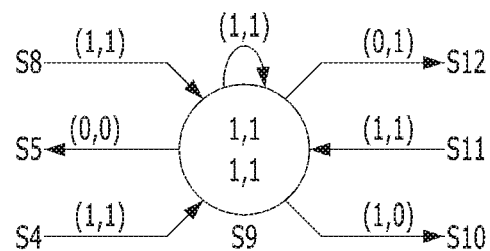
Figure 17F:
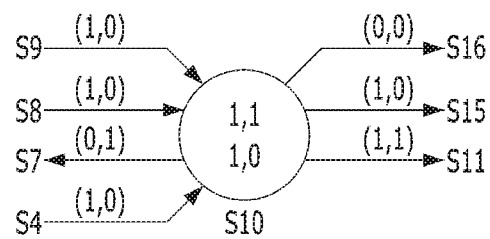
Figure 17G:
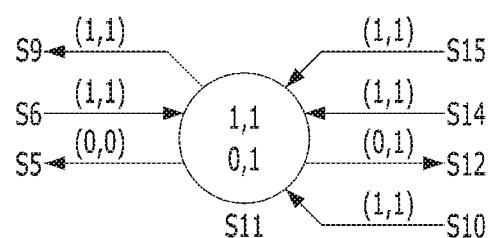
Figure 17G:
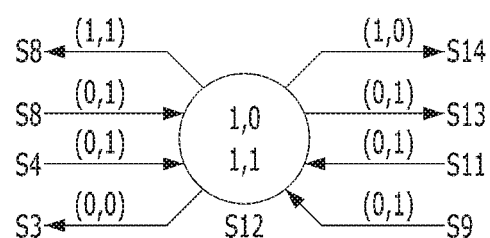
Figure 17H:
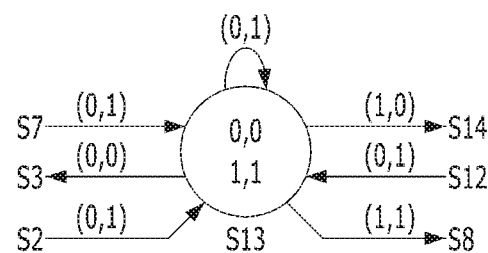
Figure 17H:
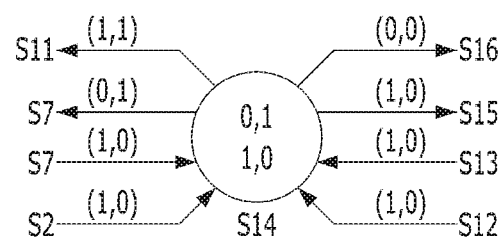
Figure 17I:
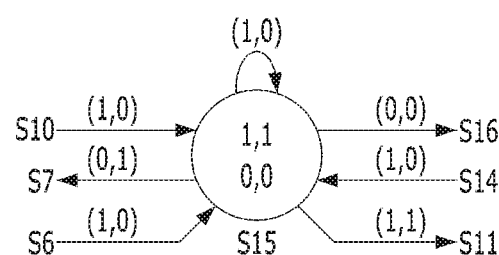
Figure 17I:
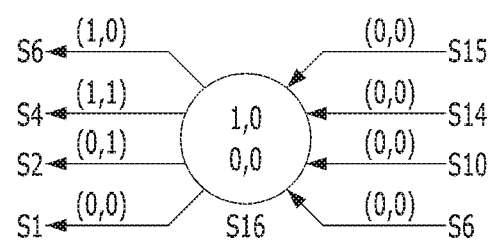

Most states including states S1 and S2 of FIG. 17B, states S3 and S4 of FIG. 17C, states S5 and S6 of FIG. 17D, states S7 and S8 of FIG. 17E, states S9 and S10 of FIG. 17F, state S12 of FIG. 17G, states S13 and S14 of FIG. 17H, and states S15 and S16 of FIG. 17I have four outgoing edges (0,0), (0,1), (1,0) and (1,1) as the possible output bits. One state S11 of FIG. 17G has only three outgoing edges to states S5, S9 and S12. In other words, if the current bits corresponding to the MSB and LCSB pages are values of (0,0), the encoding device 1000A may transition the state S11 to the state S5. If the current bits corresponding to the MSB and LCSB pages are values of (1,1), the encoding device 1000A may transition the state S11 to the state S9. If the current bits corresponding to the MSB and LCSB pages are values of (0,1), the encoding device 1000A may transition the state S11 to the state S12. Thus, the encoding device 1000A may forbid certain bit sequences (MSB=1, LCSB=0)-(MSB=1, LCSB=1)-(MSB=1, LCSB=0) from MSB and LCSB pages.

As the foregoing describes, embodiments of the present invention provide a scheme for avoiding certain harmful patterns or sequences, among program-voltage (PV) levels or symbols to be programmed in a quadruple-level cell (QLC) memory cell.

Although the foregoing embodiments have been illustrated and described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive. The present invention is intended to embrace all modifications and alternatives that fall within the scope of the claims.

What is claimed is:

1. A memory system comprising:
  a memory device including quadruple-level cells (QLCs); and
  a controller including a constrained encoding device,
  wherein the constrained encoding device includes:
    a first encoder suitable for jointly encoding, based on a constrained code, two data bits corresponding to two logical pages, selected from among multiple logical pages; and
    a second encoder suitable for independently encoding, based on an error-correction code, the encoded data bits and remaining data bits to generate symbols corresponding to a plurality of program-voltage (PV) levels, the remaining data bits corresponding to two non-selected logical pages among the multiple logical pages.

2. The memory system of claim 1, wherein the two logical pages are selected based on the mapping relationship between the PV levels and the data bits, and certain interference-prone sequences among the symbols.

3. The memory system of claim 2, wherein the two logical pages include first and third logical pages among the multiple logical pages, and the non-selected logical pages include second and fourth logical pages among the multiple logical pages.

4. The memory system of claim 3, wherein the first logical page includes the most significant bit (MSB) page,
  the second logical page includes the most center significant bit (MCSB) page,
  the third logical page includes the least center significant bit (LCSB) page, and
  the fourth logical page includes the least significant bit (LSB) page.

5. The memory system of claim 4, wherein the constrained code includes a code such that bits having interference-prone sequences are avoided, the bits corresponding to the MSB and LCSB pages.

6. The memory system of claim 5, wherein a sequence of bits corresponding to the MSB page includes a value of "111".

7. The memory system of claim 6, wherein a sequence of bits corresponding to the LCSB page includes a value of "010".

8. A memory system comprising:
  a memory device including quadruple-level cells (QLCs); and
  a controller including a constrained encoding device,
  wherein the constrained encoding device includes:
    a first encoder suitable for jointly encoding, based on a constrained code, first and third data corresponding to first and third logical pages among a plurality of logical pages; and
    a second encoder suitable for independently encoding, based on an error-correction code, second and fourth data, and the encoded first and third data to generate symbols corresponding to a plurality of program-voltage (PV) levels, the second and fourth data corresponding to second and fourth logical pages among the plurality of logical pages.

9. The memory system of claim 8, wherein the controller controls the memory device to program the symbols in the cells.

10. The memory system of claim 8, wherein the first logical page includes the most significant bit (MSB) page,
  the second logical page includes the most center significant bit (MCSB) page,
  the third logical page includes the least center significant bit (LCSB) page, and
  the fourth logical page includes the least significant bit (LSB) page.

11. The memory system of claim 10, wherein the constrained code includes a code such that bits having certain sequences are avoided, the bits corresponding to the MSB and LCSB pages, among the symbols.

12. The memory system of claim 11, wherein a sequence of bits corresponding to the MSB page includes a value of "111".

13. The memory system of claim 12, wherein a sequence of bits corresponding to the LCSB page includes a value of "010".

14. A method for operating a memory system including a memory device including quadruple-level cells (QLCs), the method comprising:
  jointly encoding, based on a constrained code, two data bits corresponding to two logical pages, selected from among multiple logical pages; and
  independently encoding, based on an error-correction code, the encoded data bits and remaining data bits to generate symbols corresponding to a plurality of program-voltage (PV) levels, the remaining data bits corresponding to two non-selected logical pages among the multiple logical pages.

15. The method of claim 14, wherein the two logical pages are selected based on the mapping relationship between the PV levels and the data bits, and certain interference-prone sequences among the symbols.

16. The method of claim 15, wherein the two logical pages include first and third logical pages among the multiple logical pages, and the non-selected logical pages include second and fourth logical pages among the multiple logical pages.

17. The method of claim 16, wherein the first logical page includes the most significant bit (MSB) page,
    the second logical page includes the most center significant bit (MCSB) page,
    the third logical page includes the least center significant bit (LCSB) page, and
    the fourth logical page includes the least significant bit (LSB) page.

18. The method of claim 17, wherein the constrained code includes a code such that bits having the interference-prone sequences are avoided, the bits corresponding to the MSB and LCSB pages.

19. The method of claim 18, wherein a sequence of bits corresponding to the MSB page includes a value of "111".

20. The method of claim 19, wherein a sequence of bits corresponding to the LCSB page includes a value of "010".

* * * * *